United States Patent
Kim

(10) Patent No.: US 12,523,807 B2
(45) Date of Patent: Jan. 13, 2026

(54) IMAGE SENSING DEVICE

(71) Applicant: SK hynix Inc., Icheon-si (KR)

(72) Inventor: Dong Ha Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 405 days.

(21) Appl. No.: 18/343,536

(22) Filed: Jun. 28, 2023

(65) Prior Publication Data
US 2024/0159947 A1 May 16, 2024

(30) Foreign Application Priority Data

Nov. 14, 2022 (KR) .................. 10-2022-0151891

(51) Int. Cl.
*G02B 5/20* (2006.01)
*G02B 5/22* (2006.01)
*H04N 23/75* (2023.01)

(52) U.S. Cl.
CPC .............. *G02B 5/201* (2013.01); *G02B 5/22* (2013.01); *H04N 23/75* (2023.01)

(58) Field of Classification Search
None
See application file for complete search history.

(56) References Cited

U.S. PATENT DOCUMENTS

| | | | | |
|---|---|---|---|---|
| 2009/0033845 A1* | 2/2009 | Tanno | ............... | G02F 1/134363 349/144 |
| 2011/0012011 A1* | 1/2011 | Jung | ................... | H10F 39/8053 250/208.1 |
| 2012/0147314 A1* | 6/2012 | Yoshizawa | ............. | G02B 5/201 315/192 |
| 2015/0185546 A1* | 7/2015 | Lee | ...................... | G02F 1/13363 349/33 |
| 2015/0302808 A1* | 10/2015 | Wang | ................... | G09G 3/3614 349/44 |
| 2015/0309360 A1* | 10/2015 | Wang | ............... | G02F 1/133514 345/694 |
| 2015/0331279 A1* | 11/2015 | Kimura | ................ | G03F 7/0007 430/7 |
| 2017/0104034 A1* | 4/2017 | Nagata | ................... | G02B 5/201 |
| 2018/0149912 A1* | 5/2018 | Zhang | ................... | G02F 1/1343 |
| 2019/0025635 A1* | 1/2019 | Chen | ................. | G02F 1/133514 |
| 2019/0271878 A1* | 9/2019 | Tsuruda | ................. | G02F 1/153 |
| 2021/0356773 A1* | 11/2021 | Guo | .................. | G02F 1/133514 |
| 2022/0020587 A1 | 1/2022 | Zhao et al. | | |
| 2022/0085543 A1 | 3/2022 | Klenk et al. | | |
| 2022/0115447 A1* | 4/2022 | Ishizuya | ............. | H10K 59/879 |
| 2022/0163841 A1* | 5/2022 | Zhang | ............... | G02F 1/133516 |
| 2022/0213296 A1* | 7/2022 | Kaneko | ................ | G03F 7/0007 |

* cited by examiner

*Primary Examiner* — Ryan Crockett
(74) *Attorney, Agent, or Firm* — Perkins Coie LLP

(57) ABSTRACT

An image sensing device includes first color filters having a first color, second color filters having a second color, third color filters having a third color, fourth color filters having a fourth color, and a grid structure disposed between adjacent color filters of the first to fourth color filters and configured to prevent crosstalk between the adjacent color filters. The grid structure includes a first grid region disposed on sides of some of the fourth color filters and a second grid region different from the first grid region, and the grid structure has different structures in the first grid region and the second grid region.

20 Claims, 10 Drawing Sheets

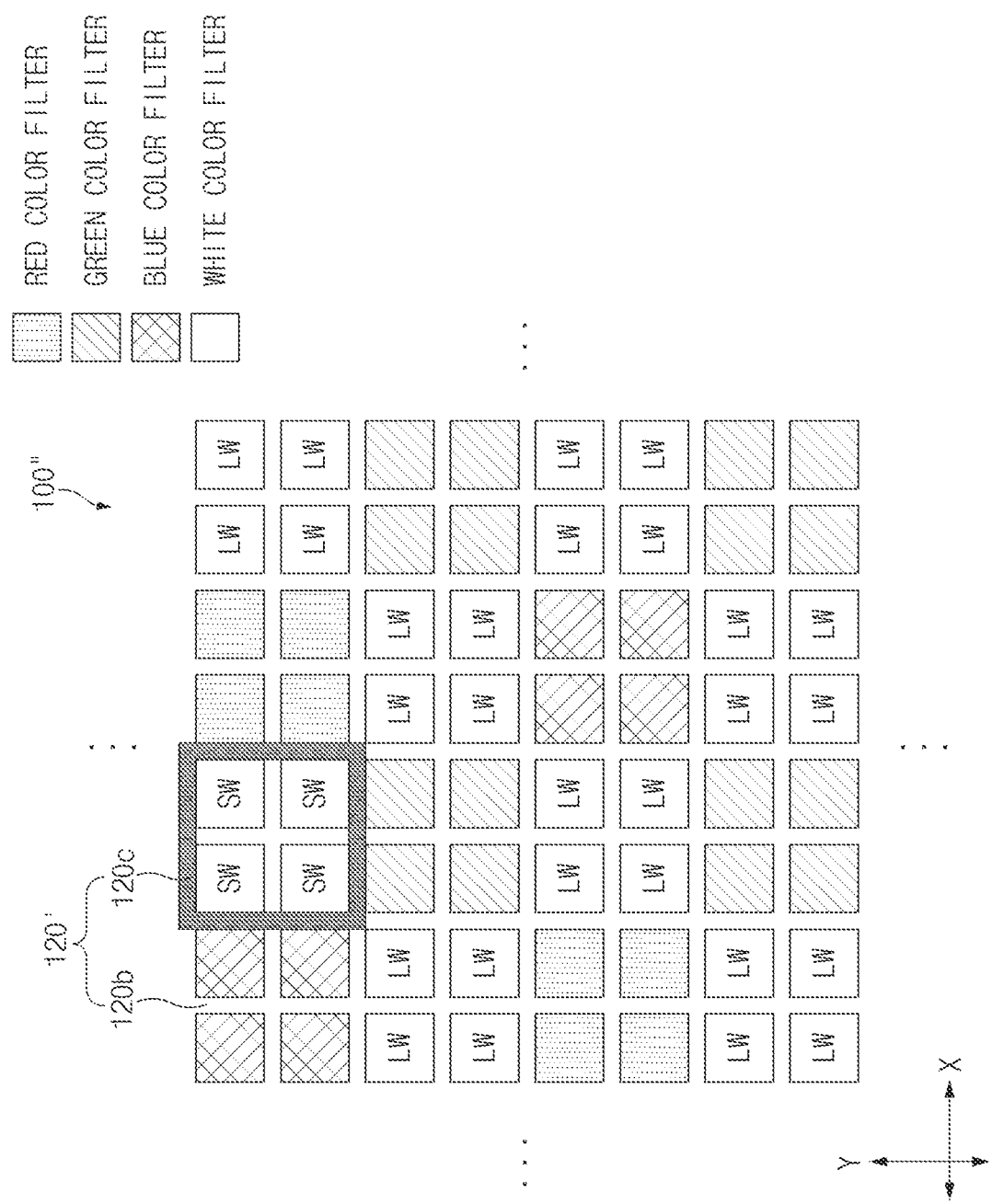

IMAGE SENSING DEVICE

CROSS-REFERENCE TO RELATED APPLICATION

This patent document claims the priority and benefits of Korean patent application No. 10-2022-0151891, filed on Nov. 14, 2022, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device capable of more easily implementing a high dynamic range (HDR) for a white pixel.

In accordance with an embodiment of the disclosed technology, an image sensing device may include first color filters configured to allow light having a first color to pass therethrough, second color filters configured to allow light having a second color to pass therethrough, third color filters configured to allow light having a third color to pass therethrough, fourth color filters configured to allow light having a fourth color to pass therethrough, and a grid structure disposed between adjacent color filters of the first to fourth color filters and configured to prevent crosstalk between the adjacent color filters. The grid structure may include a first grid region disposed on sides of some of the fourth color filters and a second grid region different from the first grid region, and the grid structure has different structures in the first grid region and the second grid region.

In accordance with another embodiment of the disclosed technology, an image sensing device may include a first sub-pixel block including first color filters configured to allow light having a first color to pass through the first color filters, a second and third sub-pixel blocks, each of the second and third sub-pixel blocks including second color filters configured to allow light having a second color to pass through the second color filters, and a fourth sub-pixel block including third color filters configured to allow light having a third color to pass through the third color filters. Each of the first to fourth sub-pixel blocks includes fourth color filters configured to allow light having a fourth color to pass through the fourth color filters. The image sensing device further comprises a grid structure disposed between adjacent color filters among the first to fourth color filters. The grid structure may include a first grid region surrounding some of the fourth color filters and a second grid region different from the first grid region and the grid structure has different structures in the first grid region and the second grid region.

In accordance with another embodiment of the disclosed technology, an image sensing device may include a first sub-pixel block including first color filters configured to allow light having a first color to pass through the first color filters and arranged adjacent to each other in an array having N columns and N rows, N being an integer equal to or greater than 2, a second sub-pixel block including second color filters configured to allow light having a second color to pass through the second color filters and arranged adjacent to each other in an array having N columns and N rows, a third sub-pixel block including third color filters configured to allow light having a third color to pass through the third color filters and arranged adjacent to each other in an array having N columns and N rows, a fourth sub-pixel block including fourth color filters configured to allow light having a fourth color to pass through the fourth color filters and arranged adjacent to each other in an array having N columns and N rows, and a grid structure disposed between the first to fourth color filters. The grid structure may include a first grid region surrounding some of the fourth color filters and a second grid region different from the first grid region and the grid structure has different structures in the first grid region and the second grid region.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIG. 8 is a schematic diagram illustrating an example of a planar structure in which pixels are arranged in the pixel array of FIG. 1 based on some implementations of the disclosed technology.

DETAILED DESCRIPTION

This patent document provides implementations and examples of an image sensing device that may be used to substantially address one or more technical or engineering issues and mitigate limitations or disadvantages encountered in some other image sensing devices. Some implementations of the disclosed technology suggest examples of an image sensing device capable of more easily implementing a high dynamic range (HDR) for a white pixel. The disclosed technology provides various implementations of an image sensing device which can more easily implement a high dynamic range (HDR) for a white pixel using a grid structure.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
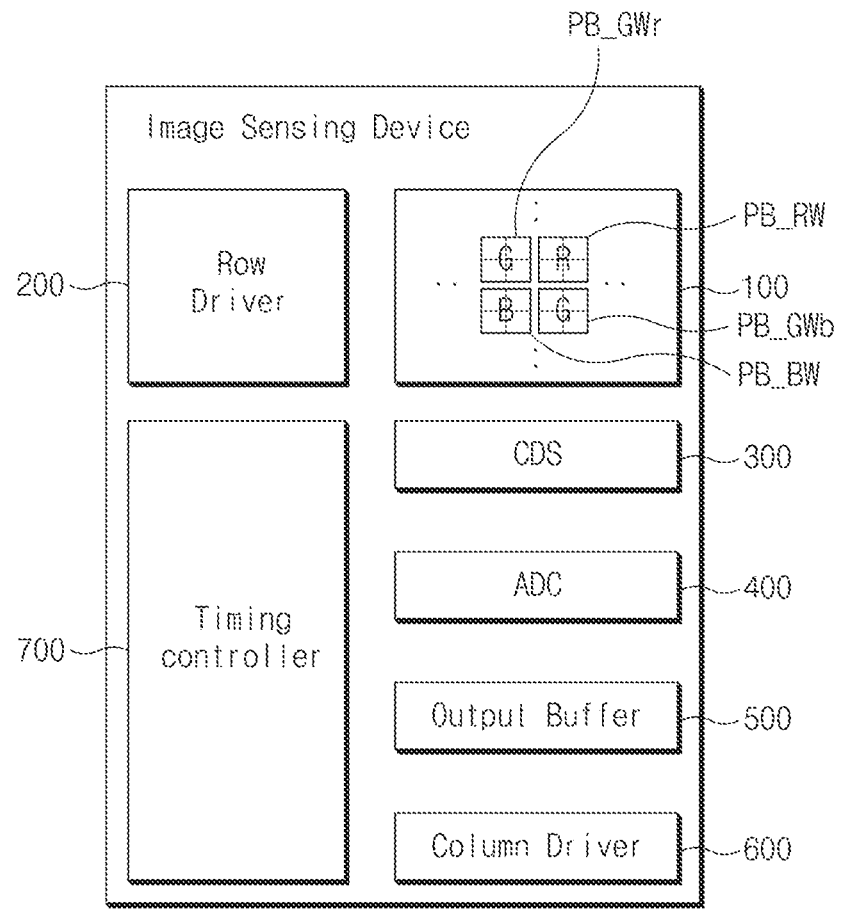
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 100, a row driver 200, a correlated double sampler (CDS) 300, an analog-digital converter (ADC) 400, an output buffer 500, a column driver 600, and a timing controller 700. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light.

The pixel array 100 may include a plurality of sub-pixel blocks (PB_R, PB_Gr, PB_Gb, PB_B) consecutively arranged in row and column directions. Each sub-pixel block (PB_R, PB_Gr, PB_Gb, PB_B) may include a plurality of unit pixels configured to generate an electrical signal (pixel signal) in response to incident light through photoelectric conversion of incident light received from the outside. Unit pixels of each sub-pixel block (PB_R, PB_Gr, PB_Gb, PB_B) may be arranged adjacent to each other in an (N×N) array (where, N is a natural number of 2 or greater).

The pixel array 100 may receive driving signals (for example, a row selection signal, a reset signal, a transmission (or transfer) signal, etc.) from the row driver 200. Upon receiving the driving signal, the unit pixels (PXs) may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700. In some implementations, the row driver 200 may select one or more pixel groups arranged in one or more rows of the pixel array 100. The row driver 200 may generate a row selection signal to select one or more rows from among the plurality of rows. The row driver 200 may sequentially enable the reset signal and the transfer signal for the unit pixels arranged in the selected row. The pixel signals generated by the unit pixels arranged in the selected row may be output to the correlated double sampler (CDS) 300.

The correlated double sampler (CDS) 300 may remove undesired offset values of the unit pixels using correlated double sampling. In one example, the correlated double sampler (CDS) 300 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 300 may obtain a pixel signal generated only by the incident light without causing noise. In some implementations, upon receiving a clock signal from the timing controller 700, the CDS 300 may sequentially sample and hold voltage levels of the reference signal and the pixel signal, which are provided to each of a plurality of column lines from the pixel array 100. That is, the CDS 300 may sample and hold the voltage levels of the reference signal and the pixel signal which correspond to each of the columns of the pixel array 100. In some implementations, the CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals. In some implementations, the ADC 400 may be implemented as a ramp-compare type ADC. The analog-to-digital converter (ADC) 400 may compare a ramp signal received from the timing controller 700 with the CDS signal received from the CDS 300, and may thus output a comparison signal indicating the result of comparison between the ramp signal and the CDS signal. The analog-to-digital converter (ADC) 400 may count a level transition time of the comparison signal in response to the ramp signal received from the timing generator 700, and may output a count value indicating the counted level transition time to the output buffer 500.

The output buffer 500 may temporarily store column-based image data provided from the ADC 400 based on control signals of the timing controller 700. The image data received from the ADC 400 may be temporarily stored in the output buffer 500 based on control signals of the timing controller 700. The output buffer 500 may provide an interface to compensate for data rate differences or transmission rate differences between the image sensing device and other devices.

The column driver 600 may select a column of the output buffer 500 upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal, may select a column of the output buffer 500 using the column selection signal, and may control the image data received from the selected column of the output buffer 500 to be output as an output signal.

The timing controller 700 may generate signals for controlling operations of the row driver 200, the ADC 400, the output buffer 500 and the column driver 600. The timing controller 700 may provide the row driver 200, the column driver 600, the ADC 400, and the output buffer 500 with a clock signal required for the operations of the respective components of the image sensing device, a control signal for timing control, and address signals for selecting a row or column. In some implementations, the timing controller 700 may include a logic control circuit, a phase lock loop (PLL) circuit, a timing control circuit, a communication interface circuit and others.

Figure 2:
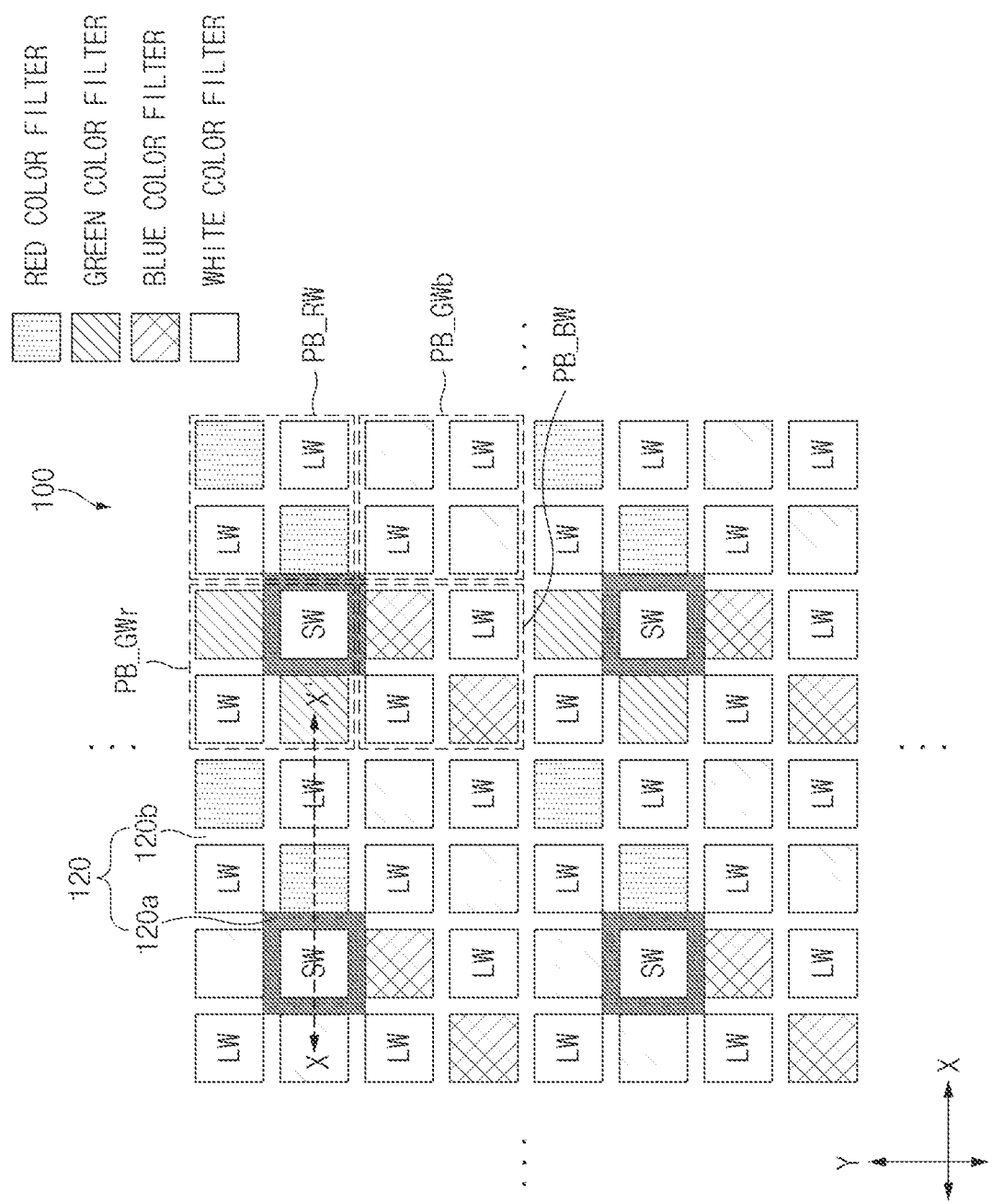
FIG. 2 is a schematic diagram illustrating an example of a planar structure in which pixels are arranged in a pixel array of FIG. 1 based on some implementations of the disclosed technology.

FIG. 2 is a schematic diagram illustrating an example of a planar structure in which pixels are arranged in the pixel array 100 of FIG. 1 based on some implementations of the disclosed technology.

The pixel array 100 may include a plurality of sub-pixel blocks (PB_RW, PB_GWr, PB_GWb, PB_BW). The sub-pixel blocks (PB_RW, PB_GWr, PB_GWb, PB_BW) may be arranged to form a matrix including rows and columns. Each of the sub-pixel blocks (PB_RW, PB_GWr, PB_GWb, PB_BW) may include a structure in which the plurality of unit pixels is arranged adjacent to each other in an (N×N) array (where, N is a natural number of 2 or greater). Each unit pixel may generate an electrical signal (pixel signal) that is produced by the photoelectric conversion of the incident light incident on each unit.

In some implementations, each of the sub-pixel blocks (PB_RW, PB_GWr, PB_GWb, PB_BW) may have a structure in which four unit pixels are arranged adjacent to each other in a (2×2) array. In the example, each of the sub-pixel blocks (PB_RW, PB_GWr, PB_GWb, PB_BW) may include color filters of two different colors.

For example, the sub-pixel block (PB_RW) may include two red color pixels and two white color pixels. The two red color pixels may be arranged adjacent to each other in a first diagonal direction, and each of the two red color pixels may include a red color filter. The two white color pixels may be arranged adjacent to each other in a second diagonal direction crossing the first diagonal direction, and each of the two white color pixels may include a white color filter. The sub-pixel block (PB_GWr) may include two green color pixels and two white color pixels, and the sub-pixel block (PB_GWb) may include two green color pixels and two white color pixels. In the example, the two green color pixels may be arranged adjacent to each other in a first diagonal direction, and each of the two green color pixels may include a green color filter. The two white color pixels may be arranged adjacent to each other in a second diagonal direction, and each of the two white color pixels may include a white color filter. The sub-pixel block (PB_BW) may include two blue color pixels and two white color pixels. In the example, the two blue color pixels may be arranged adjacent to each other in a first diagonal direction, and each of the two blue color pixels may include a blue color filter. The two white color pixels may be arranged adjacent to each other in a second diagonal direction, and each of the two white color pixels may include a white color filter.

Based on the red color, green color, and blue color respectively included in the sub-pixel blocks (PB_RW, PB_GWr, PB_GWb, PB_BW), the sub-pixel blocks (PB_RW, PB_GWr, PB_GWb, PB_BW) may be arranged in a Bayer pattern. In addition, when the pixel array 100 is viewed as a whole, the white color filters may be disposed between the red color filters, the green color filters, and the blue color filters so that the red color filters, the green color filters, and the blue color filters are not adjacent to each other in a row or a column.

In the implementations, the white color pixels include a short-exposure white color pixels (SWs) and a long-exposure white pixels (LWs). The short-exposure white color pixels (SW) and the long-exposure white pixels (LWs) are configured to receive different amounts of incident light as discussed in the below. In the example of FIG. 2, the sub-pixel block (PB_GWr) may include at least one short-exposure white color pixel (SW) for realizing a high dynamic range (HDR).

Among the white color filters, the white color filter of the short-exposure white color pixel (SW) will hereinafter be defined as a first white color filter, and the white color filter of the long-exposure white color pixel (LW) will hereinafter be defined as a second white color filter.

The short-exposure white color pixels (SWs) may be designed to allow a smaller amount of light to reach the photoelectric conversion regions within a substrate as compared to the long-exposure white color pixels (LWs) during the same exposure time. The short-exposure white color pixels (SWs) are configured to generate white pixel signals in response to a relatively smaller amount of the incident light. The long-exposure white color pixels (LWs) are configured to generate white pixel signals in response to a relatively greater amount of the incident light. Accordingly, the pixel array 100 can generate two different white pixel signals (a short-exposure white pixel signal and a long-exposure white pixel signal) in response to different amounts of light with only one exposure.

In the implementations of the disclosed technology, the grid structures 120 are disposed between two adjacent color filters to prevent crosstalk between adjacent color filters. The grid structures 120 include the first grid region 120a and the second grid region 120b. In some implementations, the first grid region 120a surrounds the first white color filter and include a light absorption layer capable of absorbing incident light. In the example, the light absorption layer may include a metal layer.

The first grid region 120a may be disposed between red color filters, green color filters, blue color filters and first white color filters. The first grid region 120a may be disposed on sides of the first white color filters. The second grid region 120b may be arranged between red color filters, green color filters, blue color filters and second white color filters. The second grid region 120b may be disposed on sides of the second white color filters. In some implementations, the first grid region 120a may include a hybrid structure in which a metal layer and an air layer are stacked. The second grid region 120b may not include a metal layer, and may include an air layer.

Therefore, in the short-exposure white color pixels (SWs) surrounded by or disposed on a side of the first grid region 120a having the metal layer having a property of a relatively good absorption of light, some of the incident light may be absorbed by the metal layer of the first grid region 120a and may not transferred to the photoelectric conversion region. On the other hand, in the long-exposure white color pixels (LWs) surrounded by or disposed on a side of the second grid region 120b not including the metal layer, the second grid region 120b may not absorb light incident upon the long-exposure white color pixels (LWs). In the example, since the second grid region 120b includes an air layer, the light incident upon the long-exposure white color pixels (LWs) may be reflected by the air layer of the second grid region 120b, so that the light can be more introduced into the photoelectric conversion regions of the long-exposure white color pixels (LW). Thus, during the same exposure time, the amount of light absorbed into the photoelectric conversion regions of the short-exposure white color pixels (SWs) becomes less than the amount of light absorbed into the photoelectric conversion regions of the long-exposure white color pixels (LWs).

Although the above-described embodiment has disclosed an example case in which the first grid region 120a includes the metal layer as a light absorption layer, other implementations are also possible. It should be noted that the first grid region 120a may include another material layer capable of absorbing light well instead of the metal layer.

In addition, although the above-described embodiment has disclosed an example case in which the sub-pixel blocks (PB_GWr) include the short-exposure white color pixel (SW), other implementations are also possible. It should be noted that each of the sub-pixel blocks (PB_GWb) instead of the sub-pixel blocks (PB_GWr) may also include the short-exposure white color pixel (SW) as necessary. Alternatively, each of the sub-pixel blocks (PB_GWr, PB_GWb) may include the short-exposure white color pixel (SW).

In addition, although FIG. 2 illustrates an example case in which the white color pixel located at a lower right side in each sub-pixel block (PB_GWr) is a short-exposure white color pixel (SW) for convenience of description, other implementations are also possible. It should be noted that a white color pixel located at an upper left side in each sub-pixel block (PB_GWr) may also be a short-exposure white color pixel (SW) as necessary.

Figure 3:
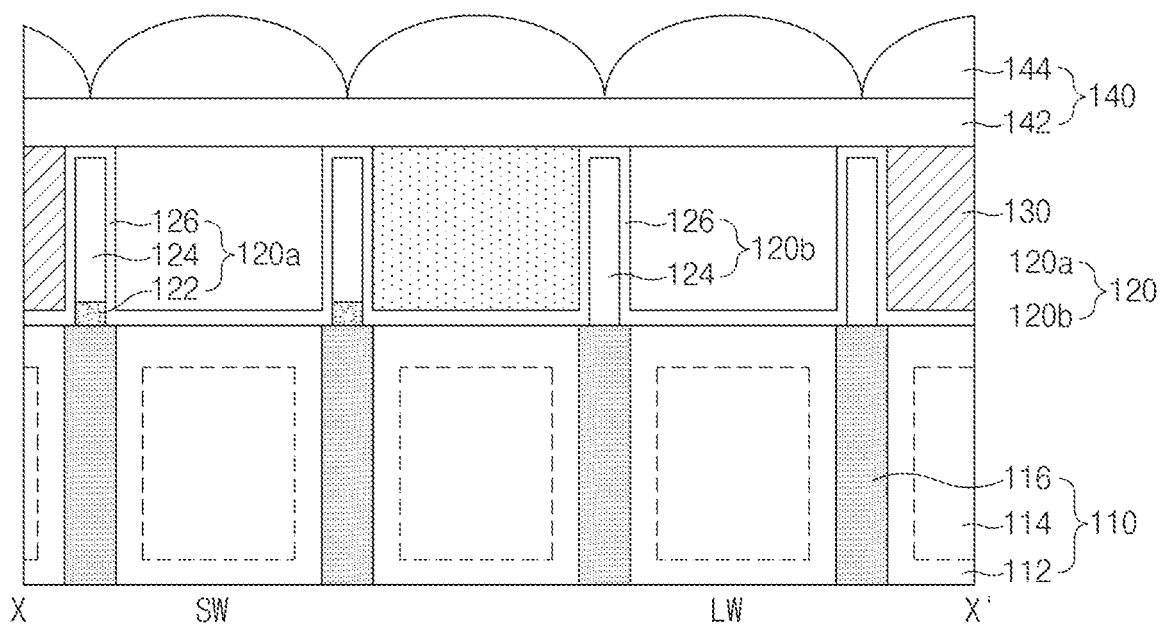
FIG. 3 is a cross-sectional view illustrating an example of a pixel array taken along the line X-X' shown in FIG. 2 based on some implementations of the disclosed technology.

FIG. 3 is a cross-sectional view illustrating an example of the pixel array 100 taken along the line X-X' shown in FIG. 2 based on some implementations of the disclosed technology.

Referring to FIG. 3, the pixel array 100 may include a substrate layer 110, a grid structure 120, a color filter layer 130, and a lens layer 140.

The substrate layer 110 may include a substrate 112, a plurality of photoelectric conversion regions 114, and a plurality of device isolation structures 116. The substrate layer 110 may include a first surface and a second surface facing away from or opposite to the first surface. In the example, the first surface may refer to a light receiving surface upon which light is incident from the outside.

The substrate 112 may include a semiconductor substrate including a monocrystalline silicon material. The substrate 112 may include P-type impurities.

The photoelectric conversion regions 114 may be formed in the semiconductor substrate 112 and each photoelectric conversion region 114 can correspond to a unit pixel. The photoelectric conversion regions 114 may perform photoelectric conversion of incident light (e.g., visible light) filtered by the color filter layer 130 to generate photocharges that carry images in the incident light. Each of the photoelectric conversion regions 114 may include N-type impurities.

Each of the device isolation structures 116 may be formed between photoelectric conversion regions 114 of the adjacent unit pixels within the substrate 112 to isolate the photoelectric conversion regions 114 from each other. The device isolation structure 116 may include a trench structure such as a Back Deep Trench Isolation (BDTI) structure or a Front Deep Trench Isolation (FDTI) structure. Alternatively, the device isolation structure 116 may include a junction isolation structure formed by implanting high-density impurities (e.g., P-type impurities) into the substrate 112.

The grid structure 120 may be disposed between the color filters to prevent crosstalk between the adjacent color filters. The grid structure 120 may be formed over the first surface (i.e., a light incident surface) of the substrate layer 110. The grid structure 120 may be formed to vertically overlap the device isolation structure 116. The grid structure 120 may include the first grid region 120a and the second grid region 120b.

The first grid region 120a may include a metal layer 122, an air layer 124, and a capping layer 126. The second grid region 120b may include the air layer 124 and the capping layer 126.

The metal layer 122 may include tungsten (W). The metal layer 122 may further include a barrier metal layer (not shown) disposed under the tungsten.

The air layer 124 may be formed over the metal layer 122 to overlap the metal layer 122. An insulation layer (not shown) may be formed between the metal layer 122 and the air layer 124.

In some implementations, whereas the first grid region 120a may include the air layer 124 and the metal layer 122, the second grid region 120b may not include the metal layer 122. In this implementation, some of the light incident upon the short-exposure white color pixel (SW) may be absorbed by the metal layer 122 of the first grid region 120a. On the other hand, light incident upon the long-exposure white color pixel (LW) may be reflected by the air layer 124 instead of being absorbed by the metal layer 122, and may be introduced into the photoelectric conversion region 114. Therefore, during the same exposure time, the amount of light transferred to the photoelectric conversion regions 114 of the short-exposure white color pixel (SW) becomes less than the amount of light flowing into the photoelectric conversion regions 114 of the long-exposure white color pixel (LW).

In some implementations, the amount of light introduced into the photoelectric conversion regions 114 of the short-exposure white color pixel (SW) may be adjusted by adjusting the configuration, e.g., the height and width, of the metal layer 122.

The capping layer 126 may be or include a material layer formed at the outermost portion of the grid structure 120, and may define region where the air layer 124 is formed in the second grid region 120b. The capping layer 126 may include an oxide layer. The capping layer 126 may be formed to extend below the color filter layer 130. The oxide layer may include an ultra-low temperature oxide (ULTO) film such as a silicon oxide ($SiO_2$) film.

The portion or region of the capping layer 126, which is disposed between the color filter layer 130 and the substrate layer 110, may operate as an anti-reflection layer that compensates for a difference in refractive index between the color filter layer 130 and the substrate 112, which enables light having penetrated the color filter 270 to be effectively incident into the substrate 112. Therefore, in some implementations, a separate anti-reflection layer need not be disposed between the color filter layer 130 and the substrate 112, which can simplify the manufacturing process of the image sensing device.

The color filter layer 130 may include color filters that filter visible light from among incident light received through the lens layer 140 and transmit the filtered light to the corresponding photoelectric conversion region 114. For example, the color filter layer 130 may include a plurality of red color filters, a plurality of green color filters, a plurality of blue color filters, and a plurality of white color pixels. Each red color filter may transmit red visible light. Each green color filter may transmit green visible light. Each blue color filter may transmit blue visible light. Each white color pixel may transmit visible light of all colors. The color filter layer 130 may be formed over the substrate layer 110 in a region defined by the grid structure 120.

The lens layer 140 may include an over-coating layer 142 and a plurality of microlenses 144. The over-coating layer 142 may be formed over the color filter layer 130. The over-coating layer 142 may operate as a planarization layer to compensate for (or remove) a step difference caused by the color filter layer 130. The microlenses 144 may be formed over the over-coating layer 142. Each of the microlenses 144 may be formed in a hemispherical shape, and may be formed per unit pixel. The microlenses 144 may converge incident light, and may transmit the converged light to the corresponding photoelectric conversion region 114. The over-coating layer 142 and the microlenses 144 may be formed of the same materials.

FIGS. 4A to 4E are cross-sectional views illustrating examples of methods for forming the grid structure shown in FIG. 3 based on some implementations of the disclosed technology.

Figure 4A:
FIGS. 4A to 4E are cross-sectional views illustrating examples of methods for forming a grid structure of FIG. 3 based on some implementations of the disclosed technology.

Referring to FIG. 4A, the metal layer 122 of the first grid region 120a may be formed over the substrate layer 110 that includes photoelectric conversion regions and a device isolation structure.

For example, after a metal material is entirely formed over the substrate layer 110, the metal material may be etched using a mask pattern (not shown) defining the region to be used as a formation region of the first grid region 120a as an etch mask, resulting in formation of the metal layer 122. In this case, the metal layer 122 may include tungsten (W).

Figure 4B:
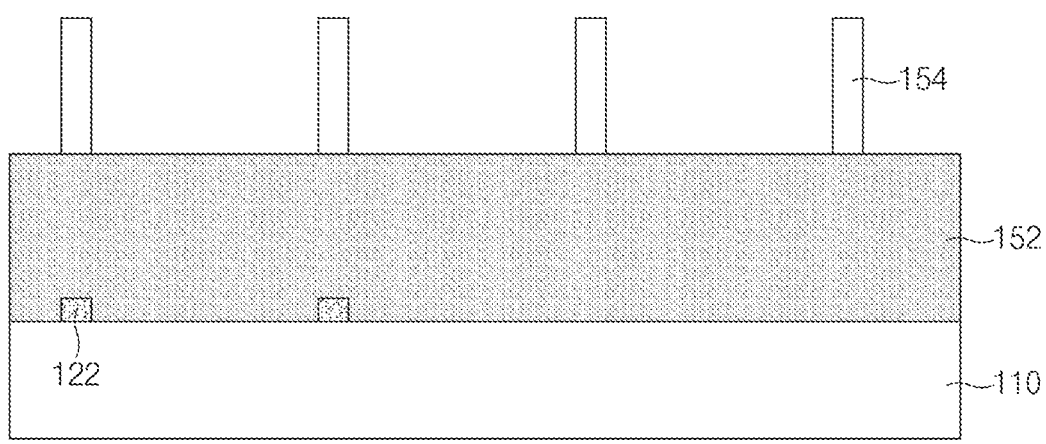

Referring to FIG. 4B, a sacrificial layer 152 may be formed to entirely cover the metal layer 122 and the substrate layer 110, and a mask pattern 154 may be formed over the sacrificial layer 152 to define a region to be used as a formation region of the grid structure 120.

In this case, the sacrificial layer 152 may include a carbon-containing Spin On Carbon (SOC) layer. The mask pattern 154 may include a photoresist pattern.

Figure 4C:
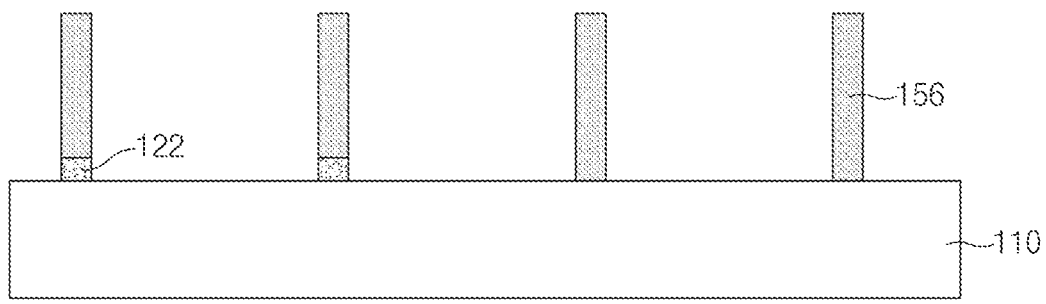

Referring to FIG. 4C, the sacrificial layer 152 may be etched using the mask pattern 154 as an etch mask, such that a sacrificial layer pattern 156 can be formed in a region where the grid structure 120 is to be formed. In this implementation, the sacrificial layer pattern 156 may be formed over the metal layer 122 in the region of the first grid region 120a. In the region of the second grid region 120b, the sacrificial layer pattern 156 may be formed directly over the substrate layer 110 without the metal layer 122.

Figure 4D:
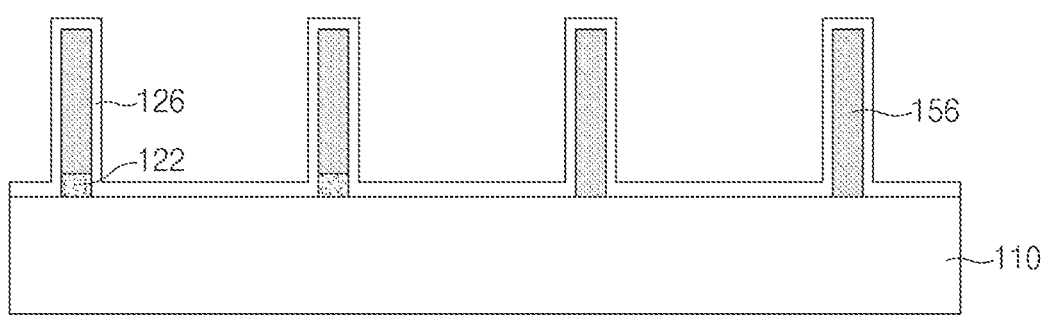

Referring to FIG. 4D, a capping layer 126 may be formed to cover the sacrificial layer pattern 156 and the substrate layer 110.

In the example, the capping layer 126 may include an Ultra Low Temperature Oxide (ULTO) layer. The capping layer 126 may be formed to a predetermined thickness through which molecules formed by combining gas with carbon of the sacrificial layer pattern 156 can be easily discharged outside.

Figure 4E:
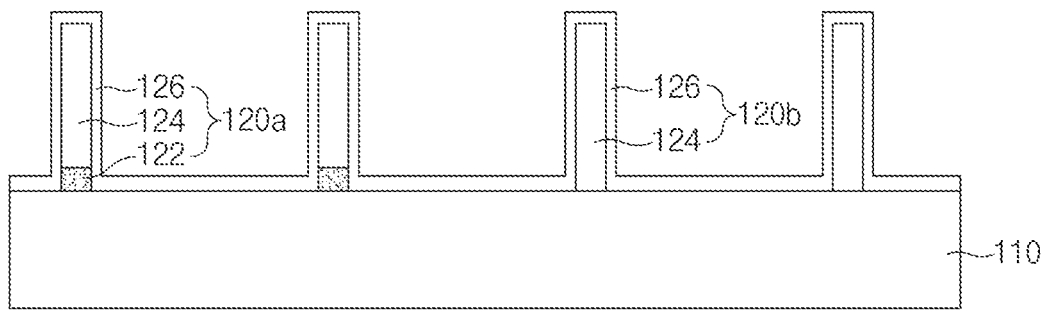

Referring to FIG. 4E, a plasma process may be carried out upon the resultant structure of FIG. 4D, such that the sacrificial layer pattern 156 may be removed and the air layer 124 may be formed at the position from which the sacrificial layer pattern 125 is removed.

In this example, the plasma process may be carried out using gas (e.g., $O_2$, $N_2$, $H_2$, CO, $CO_2$, or $CH_4$) including at least one of oxygen, nitrogen, or hydrogen. Referring to FIG. 4E, if the $O_2$ plasma process is carried out upon the resultant structure of FIG. 4D, oxygen radicals (O*) may flow into the sacrificial layer pattern 156 through the capping layer 126, and the oxygen radicals (O*) included in the sacrificial layer pattern 156 may be combined with carbons of the sacrificial layer pattern 156, resulting in formation of CO or $CO_2$. The formed CO or $CO_2$ may be discharged outside through the capping layer 126.

As a result, the sacrificial layer pattern 156 can be removed, and the air layer 124 may be formed at the position where the sacrificial layer pattern 156 is removed.

Then, the color filter layer 130 may be formed over the capping layer 126 so as to fill the regions defined by the first grid region 120a and the second grid region 120b, and the lens layer 140 may be formed over the color filter layer 130.

Figure 5:
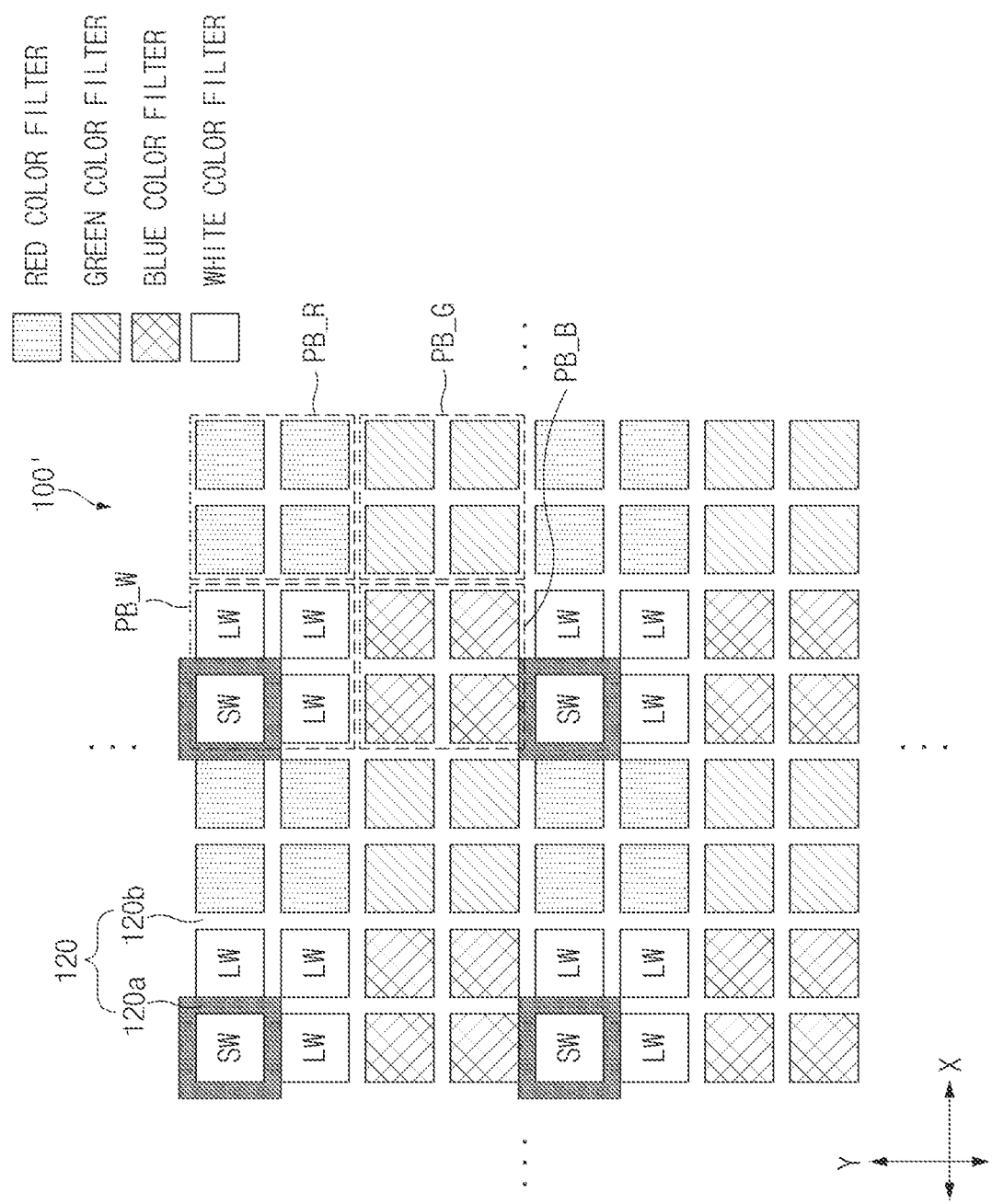
FIG. 5 is a schematic diagram illustrating an example of a planar structure in which pixels are arranged in the pixel array of FIG. 1 based on some implementations of the disclosed technology.

FIG. 5 is a schematic diagram illustrating an example of a planar structure in which pixels are arranged in the pixel array of FIG. 1 based on some implementations of the disclosed technology.

Referring to FIG. 5, the pixel array 100' may include a plurality of sub-pixel blocks (PB_R, PB_G, PB_B, PB_W). Each of the sub-pixel blocks (PB_R, PB_G, PB_B, PB_W) may include a structure in which a plurality of unit pixels is arranged adjacent to each other in an (N×N) array (where, N is a natural number of 2 or greater). Each unit pixel may generate an electrical signal (pixel signal) corresponding to the incident light through photoelectric conversion of the incident light.

In some implementations, each of the sub-pixel blocks (PB_R, PB_G, PB_B, PB_W) may have a structure in which four unit pixels having color filters of the same color are arranged adjacent to each other in a (2×2) array. In this example, the sub-pixel block (PB_R) may include four red color pixels each including a red color filter. The sub-pixel block (PB_G) may include four green color pixels each including a green color filter. The sub-pixel block (PB_B) may include four blue color pixels each including a blue color filter. The sub-pixel block (PB_W) may include four white color pixels each including a white color filter. In this example, each sub-pixel block (PB_W) may include a short-exposure white color pixel (SW) and long-exposure white color pixels (LW).

In the pixel array 100', the sub-pixel blocks (PB_R, PB_G, PB_B, PB_W) may be arranged adjacent to each other in a (2×2) array. For example, the color filters of the sub-pixel blocks (PB_R, PB_G, PB_B, PB_W) may be arranged in a pattern in which the green color pixels located next to the red color filters in the Bayer pattern are replaced with white color pixels.

As shown in FIGS. 2 and 3, in the grid structure 120 disposed between the color filters, the first grid region 120a surrounding the first white color filter corresponding to the short-exposure white color pixel (SW) may include a light absorption layer and an air layer, and the remaining second grid region 120b may include an air layer without the light absorption layer.

Figure 6:
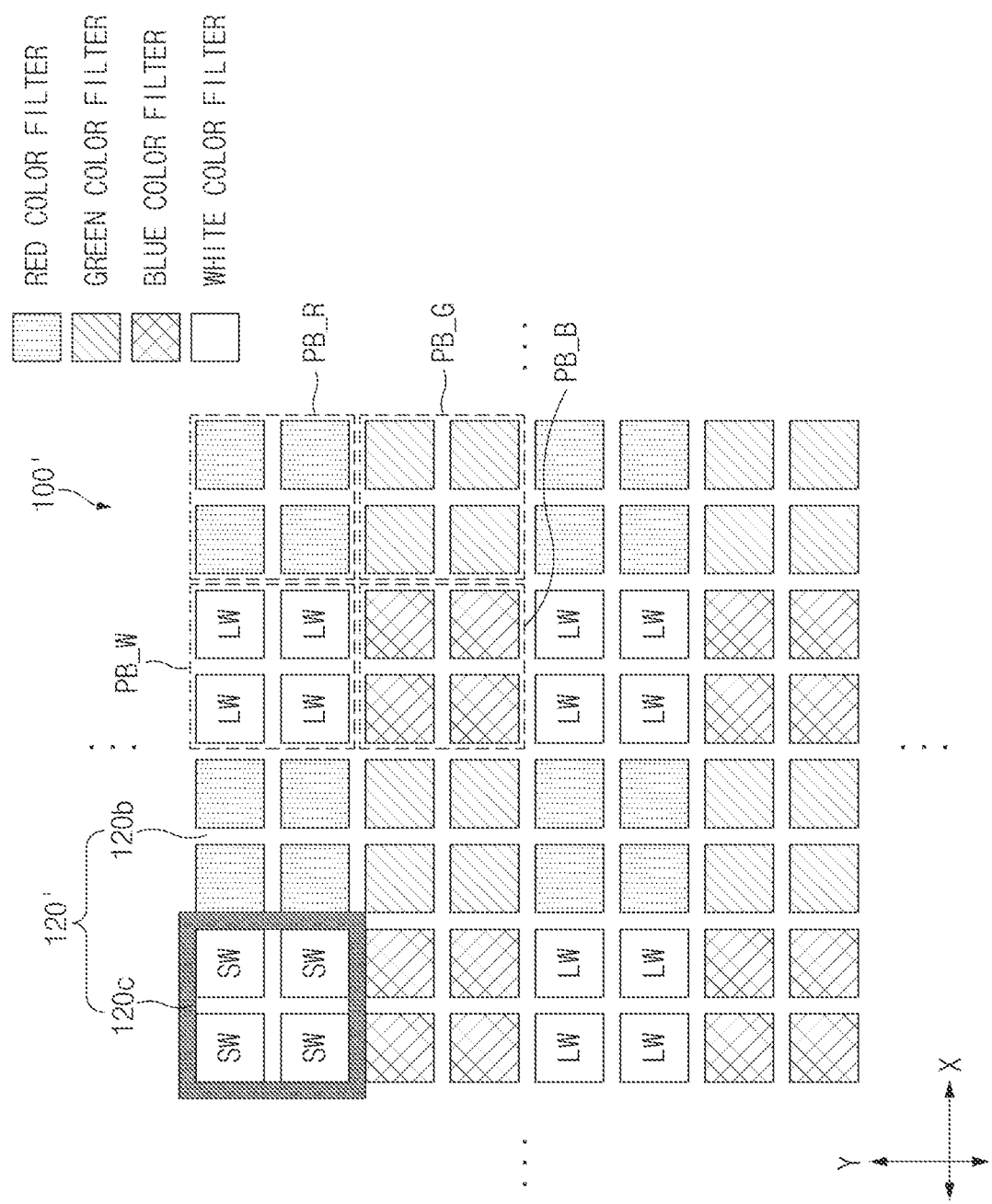
FIG. 6 is a schematic diagram illustrating an example of a planar structure in which pixels are arranged in the pixel array of FIG. 1 based on some implementations of the disclosed technology.

FIG. 6 is a schematic diagram illustrating an example of a planar structure in which pixels are arranged in the pixel array of FIG. 1 based on some implementations of the disclosed technology.

Referring to FIG. 6, in some implementations, four short-exposure white color pixels (SWs) may be arranged adjacent to each other in a (2×2) array. For example, some of the sub-pixel blocks (PB_Ws) may be short-exposure white sub-pixel blocks (PB_W) including only short-exposure white color pixels (SWs), and the short-exposure white sub-pixel blocks (PB_Ws) may be arranged one by one for the four white sub-pixel blocks (PB_Ws).

From among the grid structure 120', a region (i.e., the first grid region) 120c surrounding the first white color filters of the short-exposure white sub-pixel block (PB_W) may include a light absorption layer and an air layer, and the remaining region (i.e., the second grid region) 120b may include an air layer without a light absorption layer. In this example, the grid structure 120' disposed between adjacent first white color filters in the short-exposure white sub-pixel block (PB_W) may be formed as a second grid region 120*b* including an air layer without a light absorption layer. Alternatively, there may be no grid structure between adjacent first white color filters in the short-exposure white sub-pixel block (PB_W).

Figure 7:
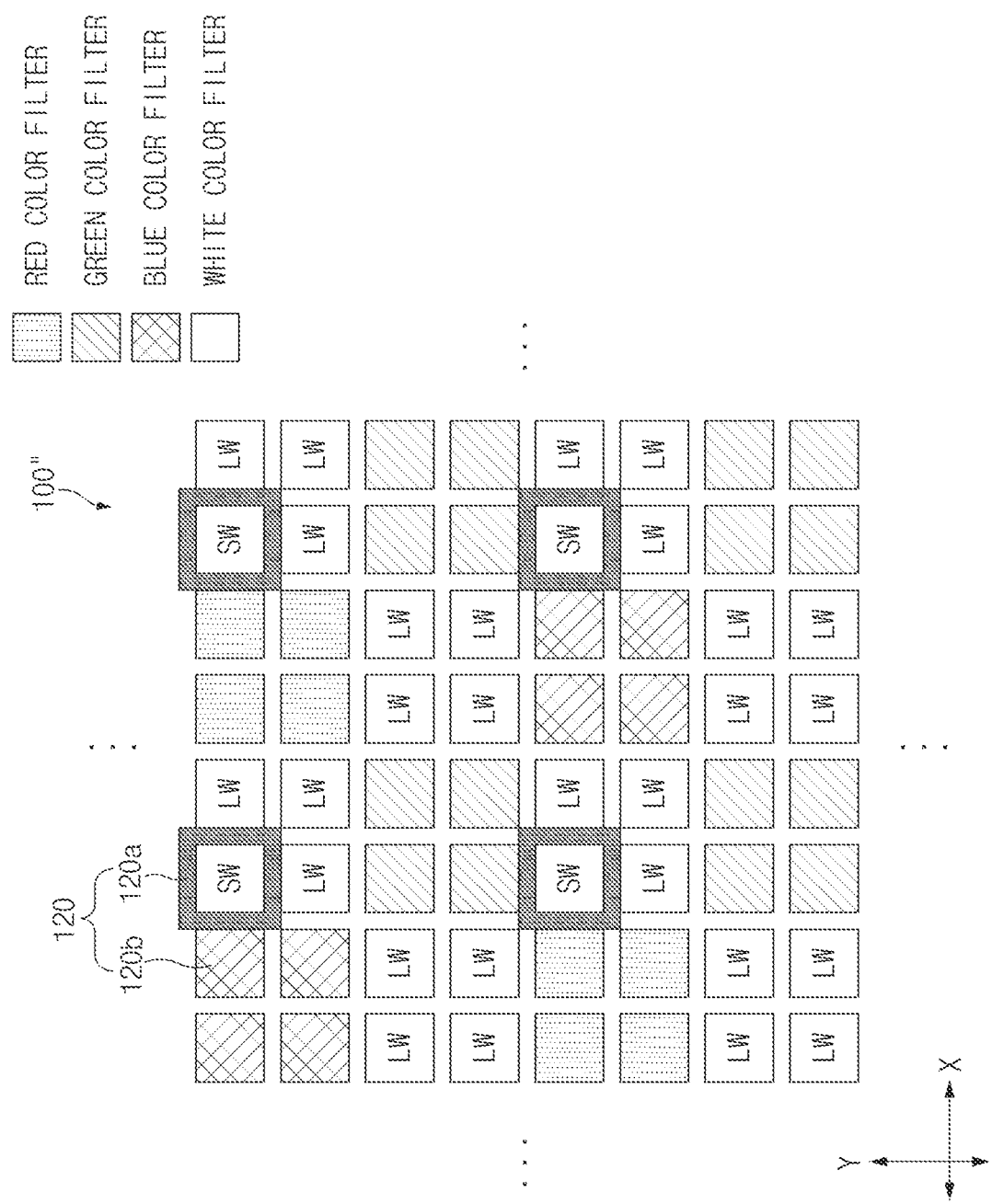
FIG. 7 is a schematic diagram illustrating an example of a planar structure in which pixels are arranged in the pixel array of FIG. 1 based on some implementations of the disclosed technology.

FIGS. 7 and 8 are schematic diagrams illustrating examples of a planar structure in which pixels are arranged in the pixel array of FIG. 1 based on some implementations of the disclosed technology.

Referring to FIGS. 7 and 8, a pixel array 100″ may include a plurality of sub-pixel blocks (PB_R, PB_G, PB_B, PB_W). Each of the sub-pixel blocks (PB_R, PB_G, PB_B, PB_W) may have a structure in which four unit pixels having color filters of the same color are arranged adjacent to each other in a (2×2) array. In this example, the sub-pixel block (PB_R) may include four red color pixels each including a red color filter. The sub-pixel block (PB_G) may include four green color pixels each including a green color filter. The sub-pixel block (PB_B) may include four blue color pixels each including a blue color filter. The sub-pixel block (PB_W) may include four white color pixels each including a white color filter. The sub-pixel blocks (PB_Ws) may be disposed between the sub-pixel blocks (PB_R, PB_G, PB_B) such that the sub-pixel blocks (PB_R, PB_G, PB_B) are not arranged adjacent to each other.

Some of the sub-pixel blocks (PB_Ws) may include short-exposure white color pixels (SWs) and long-exposure white color pixels (LWs), as shown in FIG. 7. Alternatively, some of the sub-pixel blocks (PB_Ws) may include only short-exposure white color pixels (SWs), as shown in FIG. 8.

From among the grid structures 120 and 120′ disposed between the color filters, the region (i.e., the first grid region) 120*a* or 120*c* surrounding the first white color filters corresponding to the short-exposure white color pixels (SWs) may include the light absorption layer and the air layer, and the remaining region (i.e., the second grid region) 120*b* may include the air layer without the light absorption layer. The grid structure disposed between adjacent first white color filters in the short-exposure white sub-pixel block (PB_W) may be formed as a second grid region including the air layer without the light absorption layer.

As is apparent from the above description, the image sensing device based on some implementations of the disclosed technology can more easily implement a high dynamic range (HDR) for a white pixel using a grid structure.

The embodiments of the disclosed technology may provide a variety of effects capable of being directly or indirectly recognized through the above-mentioned patent document.

Although a number of illustrative embodiments have been described, it should be understood that various modifications or enhancements of the disclosed embodiments and other embodiments can be devised based on what is described and/or illustrated in this patent document.

What is claimed is:

1. An image sensing device comprising:
   first color filters configured to allow light having a first color to pass therethrough;
   second color filters configured to allow light having a second color to pass therethrough;
   third color filters configured to allow light having a third color to pass therethrough;
   fourth color filters configured to allow light having a fourth color to pass therethrough; and
   a grid structure disposed between adjacent color filters of the first to fourth color filters and configured to prevent crosstalk between the adjacent color filters,
   wherein the grid structure includes a first grid region disposed on sides of some of the fourth color filters and a second grid region different from the first grid region, and wherein the grid structure has different structures in the first grid region and the second grid region.

2. The image sensing device according to claim 1, wherein:
   the first to fourth color are different from one another.

3. The image sensing device according to claim 1, wherein the first grid region includes:
   a light absorption layer; and
   a capping layer formed to cover the light absorption layer, and
   wherein the light absorption layer and the capping layer define a space filled with air to provide an air layer.

4. The image sensing device according to claim 3, wherein:
   the light absorption layer includes a metal layer.

5. The image sensing device according to claim 3, wherein the second grid region includes:
   a capping layer disposed to define a space filled with air to provide an air layer covered by the capping layer.

6. The image sensing device according to claim 1, wherein:
   the fourth color filters are disposed between the first to third color filters so that the first to third color filters are not adjacent to each other.

7. The image sensing device according to claim 1, wherein:
   the first to fourth color filters are located such that color filters of a same color are arranged adjacent to each other in an array having N columns and N rows, N being an integer equal to or greater than 2.

8. An image sensing device comprising:
   a first sub-pixel block including first color filters configured to allow light having a first color to pass through the first color filters,
   a second and third sub-pixel blocks, each of the second and third sub-pixel blocks including second color filters configured to allow light having a second color to pass through the second color filters; and
   a fourth sub-pixel block including third color filters configured to allow light having a third color to pass through the third color filters,
   wherein each of the first to fourth sub-pixel blocks includes fourth color filters configured to allow light having a fourth color to pass through the fourth color filters,
   wherein the image sensing device further comprises a grid structure disposed between adjacent color filters among the first to fourth color filters, and
   wherein the grid structure includes a first grid region surrounding some of the fourth color filters and a second grid region different from the first grid region, and the grid structure has different structures in the first grid region and the second grid region.

9. The image sensing device according to claim 8, wherein:
   the first to third color filters are arranged adjacent to each other in a first diagonal direction within a corresponding sub-pixel block.

10. The image sensing device according to claim 9, wherein:

the fourth color filters are disposed adjacent to each other in a second diagonal direction crossing the first diagonal direction within the first to fourth sub-pixel blocks.

11. The image sensing device according to claim 8, wherein:
the fourth color filters are disposed between the first to third color filters so that the first to third color filters are not adjacent to each other.

12. The image sensing device according to claim 8, wherein:
the first grid region is disposed to surround any one of the fourth color filters in the second or third sub-pixel block.

13. The image sensing device according to claim 12, wherein the first grid region includes:
a light absorption layer; and
a capping layer formed to cover the light absorption layer, and
wherein the light absorption layer and the capping layer define a space filled with air to provide an air layer.

14. The image sensing device according to claim 13, wherein:
the light absorption layer includes a metal layer.

15. The image sensing device according to claim 13, wherein the second grid region includes:
a capping layer disposed to define a space filled with air to provide an air layer covered by the capping layer.

16. An image sensing device comprising:
a first sub-pixel block including first color filters configured to allow light having a first color to pass through the first color filters and arranged adjacent to each other in an array having N columns and N rows, N being an integer equal to or greater than 2;
a second sub-pixel block including second color filters configured to allow light having a second color to pass through the second color filters and arranged adjacent to each other in an array having N columns and N rows;
a third sub-pixel block including third color filters configured to allow light having a third color to pass through the third color filters and arranged adjacent to each other in an array having N columns and N rows;
a fourth sub-pixel block including fourth color filters configured to allow light having a fourth color to pass through the fourth color filters and arranged adjacent to each other in an array having N columns and N rows; and
a grid structure disposed between the first to fourth color filters,
wherein
the grid structure includes a first grid region surrounding some of the fourth color filters and a second grid region different from the first grid region, and the grid structure has different structure in the first grid region and the second grid region.

17. The image sensing device according to claim 16, wherein:
the fourth sub-pixel blocks are disposed between the first to third sub-pixel blocks so that the first to third sub-pixel blocks are not adjacent to each other.

18. The image sensing device according to claim 16, wherein the first grid region includes:
a light absorption layer; and
a capping layer formed to cover the light absorption layer; and
wherein the light absorption layer and the capping layer define a space filled with air to provide an air layer.

19. The image sensing device according to claim 18, wherein:
the light absorption layer includes a metal layer.

20. The image sensing device according to claim 18, wherein the second grid region includes:
a capping layer disposed to define a space filled with air to provide an air layer covered by the capping layer.

* * * * *